(12) United States Patent
Kadota

(10) Patent No.: US 6,346,864 B1
(45) Date of Patent: Feb. 12, 2002

(54) SAW RESONATOR FILTER AND DUPLEXER UTILIZING SH WAVES, SUBSTRATE EDGE REFLECTION, AND SUB-INTERDIGITAL TRANSDUCER PORTIONS

(75) Inventor: Michio Kadota, Kyoto (JP)

(73) Assignee: Murata Manufacturing Co., LTD, Kyoto (JP)

( * ) Notice: Subject to any disclaimer, the term of this patent is extended or adjusted under 35 U.S.C. 154(b) by 0 days.

(21) Appl. No.: 09/494,857

(22) Filed: Feb. 1, 2000

(30) Foreign Application Priority Data

Feb. 19, 1999 (JP) ............................. 11-042208

(51) Int. Cl.[7] .............................. H03H 9/64; H03H 9/72
(52) U.S. Cl. ..................... 333/133; 333/193; 310/313 B
(58) Field of Search ................................. 333/193–196, 333/133; 310/313 R, 313 B, 313 C, 313 D

(56) References Cited

U.S. PATENT DOCUMENTS

| | | | | |
|---|---|---|---|---|
| 3,801,935 A | * | 4/1974 | Mitchell | 333/193 |
| 4,223,284 A | * | 9/1980 | Inoue et al. | 333/196 X |
| 4,425,554 A | * | 1/1984 | Morishita et al. | 333/195 |
| 5,363,073 A | * | 11/1994 | Higgins | 333/195 |
| 5,363,074 A | * | 11/1994 | Higgins, Jr. | 333/195 |
| 5,585,770 A | * | 12/1996 | Higgins, Jr. | 333/193 |
| 5,793,266 A | * | 8/1998 | Allen et al. | 333/193 |
| 5,977,686 A | * | 11/1999 | Kadota et al. | 310/313 B |
| 5,986,523 A | * | 11/1999 | Morozumi et al. | 333/196 X |
| 5,990,762 A | * | 11/1999 | Nakamura et al. | 333/195 |
| 6,150,900 A | * | 11/2000 | Kadota et al. | 310/313 B X |

FOREIGN PATENT DOCUMENTS

| | | | |
|---|---|---|---|
| JP | 1-120110 | * 5/1989 | 333/193 |
| JP | 5-291869 | 11/1993 | |
| JP | 9-69751 | 3/1997 | |
| JP | 10-261938 | 9/1998 | |

OTHER PUBLICATIONS

M. .A. Sharif, et al., "Coupled Resonator Filters With Differential Input and/or Differential Output", 1995 IEEE Ultrasonics Symposium, vol. 1, 95CH35844 ISSN: 1051–0117, Nov. 7–10, 1995, pp. 67–70.

(List continued on next page.)

Primary Examiner—Benny Lee
Assistant Examiner—Barbara Summons
(74) Attorney, Agent, or Firm—Keating & Bennett, LLP

(57) ABSTRACT

A SAW resonator filter which generates Shear Horizontal type surface acoustic waves includes a piezoelectric substrate, and first and second resonators arranged on the piezoelectric substrate. The first and second resonators include first and second interdigital transducers having electrode fingers, respectively. The first and second interdigital transducers are acoustically coupled to form a filter, and are divided into a plurality of sub-interdigital transducer portions, respectively. By dividing the interdigital transducers to have multiple sub-IDT portions, the effective electromechanical coupling coefficient is reduced, thereby enabling the bandwidth to be made narrower. Further, the improvement in the electrode structure allows for the filter to use a piezoelectric substrate having excellent temperature characteristics, so that it is possible to achieve a SAW resonator filter having a narrow bandwidth and superior temperature characteristics. Moreover, when an edge reflection type SAW resonator filter using SH-type surface acoustic waves is made, it is possible to provide a compact bandpass filter having low insertion loss and excellent selectability.

18 Claims, 14 Drawing Sheets

OTHER PUBLICATIONS

B. Wall, et al., "Balanced Driven Transversely Coupled Waveguide Resonator Filters", 1996 IEEE Ultrasonics Symposium, vol. 1 96CH35993 ISSN: 1051–0117, Nov. 3–6, 1996, pp. 47–51.

M. Solal, et al., "A New Low Impedance Balanced Drive Structure for Saw Transversely Coupled Resonator Filters", 1997 IEEE Ultrasonics Symposium, vol. 1, 97CH26118 ISSN: 1051–0117, Oct. 1997, pp. 83–88.

T. Kojima, et al., "Fundamental Investigation of Two–Port SAW Resonator Using Series–Connected IDTS", Japan Society of Promotion of Science,$150^{th}$ Committee on Surface Acoustic Technology, Papers of $61^{st}$ Research Meeting, pp. 98–101, Jan. 25–26, 1999.

T. Kojima, et al., "Two–Port Saw Resonator Using Series Connected IDTS", 1998 IEEE Ultrasonics Symposium, vol. 1, 98CH36102 ISSN: 1051–0117, Oct. 1998, pp. 81–86.

* cited by examiner

SAW RESONATOR FILTER AND DUPLEXER UTILIZING SH WAVES, SUBSTRATE EDGE REFLECTION, AND SUB-INTERDIGITAL TRANSDUCER PORTIONS

BACKGROUND OF THE INVENTION

1. Field of the Invention

This invention relates to a SAW resonator filter and more specifically, the present invention relates to a SAW resonator filter having a narrow bandwidth and having a compact size.

2. Description of the Related Art

A SAW (surface acoustic wave) filter is widely used as a bandpass filter in communications devices and other electronic devices. SAW filters include a transverse-type SAW filter, which has two interdigital transducers (IDTs) arranged on a piezoelectric substrate with a predetermined distance therebetween, and a SAW resonator filter having a resonator including an IDT provided on a piezoelectric substrate.

An edge reflection type SAW resonator filter using Shear Horizontal (SH) surface acoustic waves such as Love waves and Bleustein-Gulyaev-Shimuzu (BGS) waves and other similar waves, is known as a SAW resonator filter. In an edge reflection type SAW resonator filter, the resonator is provided between two opposite edges of the piezoelectric substrate, and the edges are used to reflect the SH waves. Since reflectors are not needed, a compact filter can be realized.

Further, an edge reflection type longitudinally coupled SAW resonator filter, and a transversely coupled SAW resonator filter, which are made by coupling two SAW resonators, is already known (e.g. Japan Unexamined Patent Publication Nos. 9-69751 and 10-261938).

FIG. 19 is a perspective view showing an example of a conventional edge reflection type, longitudinally coupled SAW resonator filter. The longitudinally coupled SAW resonator filter 51 includes IDTs 53 and 54 which are provided on a rectangular piezoelectric substrate 52. The IDTs 53 and 54 are edge reflection type surface acoustic wave resonators, and are aligned along the direction of propagation of the surface acoustic wave.

Alternatively, FIG. 20 shows a conventional edge reflection type, transversely coupled SAW resonator filter. The transversely coupled SAW resonator filter 61 includes IDTs 63 and 64 which are provided on a rectangular piezoelectric substrate 62. Each of the IDTs 63 and 64 is an edge reflection type surface acoustic wave resonator, but here the IDTs 63 and 64 are aligned perpendicular to the direction of propagation of the surface acoustic wave.

There is a great demand for a filter having a narrow bandwidth in order to improve the degree of selection. In the conventional SAW resonator filters 51 and 61, the bandwidth is reduced by methods that include: (1) using piezoelectric substrates 52 and 62 that have small electromechanical coupling coefficients; (2) making the thickness of the electrodes of the IDTs smaller, thereby lowering the effective electromechanical coupling coefficients thereof; or (3) adjusting the distance between the IDTs, and bringing the resonant frequencies of the two resonators closer together; and other similar methods.

The problem with the first method is that it is necessary to select a piezoelectric material for the piezoelectric substrate that is suitable for its intended purpose, and it is difficult to obtain a material which has an electromechanical coupling coefficient appropriate for the required bandwidth. Further, it is extremely difficult to find materials that are suitable for the necessary bandwidth and which also have excellent temperature characteristics The problem with the second method is that when the thickness of the electrodes of the IDTs is decreased, vibration energy caused by the piezoelectric effect leads to conversion of the waves to bulk waves and deterioration the desired filter characteristics. Further, there are limits to the amount of narrowing of the bandwidth that can be achieved.

The problem with the third method is that when the resonant frequencies of the two resonance modes are brought too close together, the two resonance modes become almost joined, thus increasing insertion loss.

SUMMARY OF THE INVENTION

To overcome the problems described above, preferred embodiments of the present invention provide a SAW resonator filter having a narrow bandwidth without increasing the insertion loss, having excellent temperature characteristics, and IDTs that have sufficient electrode thickness.

A preferred embodiment of the present invention provides a SAW resonator filter which generates SH-type surface acoustic waves and that includes a piezoelectric substrate, and first and second resonators arranged on the piezoelectric substrate, the first and second resonators including first and second interdigital transducers having electrode fingers, respectively, wherein the first and second interdigital transducers are acoustically coupled to form a filter, and wherein the first and second interdigital transducers are divided into a plurality of sub-interdigital transducer portions, respectively.

In one preferred embodiment of the present invention, the first and second IDTs are preferably divided to have two to four sub-IDT portions.

Also, in other preferred embodiments, the first and second interdigital transducers may either be longitudinally coupled or transversely coupled.

Note that by dividing the interdigital transducers to have multiple sub-IDT portions, the effective electromechanical coupling coefficient is reduced, thereby enabling the bandwidth to be made narrower. Further, the improvement in electrode structure allows for the filter to use a piezoelectric substrate having excellent temperature characteristics, so that it is possible to achieve a SAW resonator filter having a narrow bandwidth and superior temperature characteristics. Moreover, when an edge reflection type SAW resonator filter using SH-type surface acoustic waves is made, it is possible to provide a compact band filter having low loss and excellent selectability.

In another preferred embodiment of the present invention, a communication apparatus includes a duplexer, wherein the duplexer includes the above-described resonator filter having first and second interdigital transducers that are divided into a plurality of sub-interdigital transducers, respectively.

Other elements, features and advantages of the present invention will be described in detail below with reference to preferred embodiments of the present invention and the attached drawings.

BRIEF DESCRIPTION OF THE ATTACHED DRAWINGS

The present invention will become more fully understood from the detailed description given herein below and the accompanying drawings which are given by way of illustration only, and thus do not limit the present invention and wherein.

DETAILED DESCRIPTION OF PREFERRED EMBODIMENTS

Figure 1:
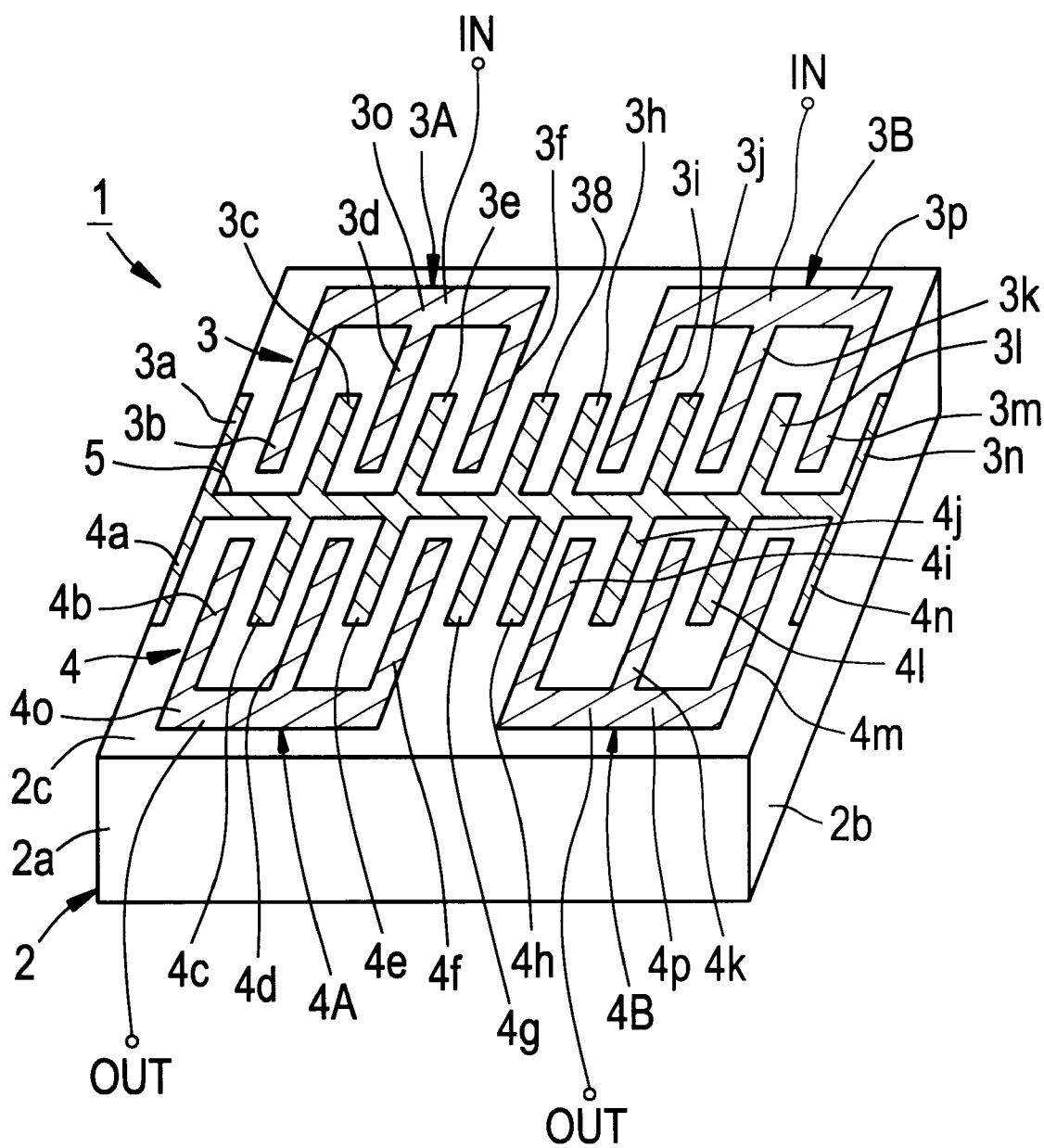
FIG. 1 is a perspective view of a transversely coupled SAW resonator filter according to a preferred embodiment of the present invention.

FIG. 1 is a perspective view of a transversely coupled SAW resonator filter according to a preferred embodiment of the present invention. Referring to FIG. 1, the transversely coupled SAW resonator filter 1 preferably includes a substantially rectangular piezoelectric substrate 2. The piezoelectric substrate 2 is preferably made of a piezoelectric single-crystal such as $LiTaO_3$, $LiNbO_3$, and quartz, or a piezoelectric ceramic such as a lead titanate zirconate ceramic. When the piezoelectric substrate 2 is made of a piezoelectric ceramic, the piezoelectric substrate 2 is polarized in a direction that is substantially parallel to a direction in which electrode fingers of IDTs 3 and 4 extend.

The piezoelectric substrate 2 has edges 2a and 2b that face each other. The direction that a line connecting the edges 2a and 2b extends is the direction in which SH-type surface acoustic waves propagate.

The IDTs 3 and 4 are provided on a top surface 2c of the substrate 2, and extend in a direction that is substantially perpendicular to the direction of propagation of the surface acoustic wave and define first and second SAW resonators, respectively. Furthermore, the first and second resonators are acoustically coupled to define a transversely coupled SAW resonator filter.

One of the novel features of the SAW filter of preferred embodiments of the present invention resides in the structure of the IDT that constitutes each resonator. The IDT of each SAW resonator is divided into a plurality of sub-IDTs, which are connected in series and aligned in a direction in which the excited SH-type waves propagate.

More specifically, the IDT 3 is preferably divided into sub-IDT portions 3A and 3B so that sub-IDT portions 3A and 3B are arranged along the surface acoustic wave propagation direction. In addition, the sub-IDT portions 3A and 3B are electrically connected in series via a common bus bar 5 that is located between a pair of input terminals IN. The IDT 4 is also divided so that sub-IDT portions 4A and 4B are arranged along the surface acoustic wave propagation direction, and, the sub-IDT portions 4A and 4B are electrically connected in series via a common bus bar 5 that is located between a pair of output terminals OUT.

The IDT 3 has a plurality of electrode fingers 3a to 3n, and the IDT 4 has a plurality of electrode fingers 4a to 4n. Since the IDT 4 preferably has approximately the same constitution as the IDT 3, the structure of the IDTs 3 and 4 will be explained with reference to IDT 3.

The electrode fingers 3a to 3n are arranged in sequence along the direction of propagation of the surface acoustic wave. Of these, the sub-IDT portion 3A has electrode fingers 3a to 3g, and the sub-IDT portion 3B has electrode fingers 3h to 3n.

In the sub-IDT portion 3A, the electrode fingers 3a, 3c, 3e, and 3g are electrically connected to the common bus bar 5 that extends along the surface acoustic wave propagation direction at the approximate center of the top surface 2c of the piezoelectric substrate 2. One end of each of the electrode fingers 3b, 3d, 3e, and 3f is electrically connected to a bus bar 3o. The electrode fingers 3a, 3c, 3e, and 3g are arranged so as to interdigitate with the electrode fingers 3b, 3d, and 3f. In the sub-IDT portion 3B, ends of the electrode fingers 3h, 3j, 3l, and 3n are connected to the common bus bar 5, and one end of the electrode fingers 3i, 3k, and 3m are electrically connected to a bus bar 3p.

Note that the adjacent outermost electrode fingers 4g and 4h of the sub-IDTs 4A and 4B and the adjacent outermost electrode fingers 3g and 3h of the sub-IDTs 3A and 3B are electrically connected, respectively.

The electrode fingers 3a and 3n have a width of approximately $\lambda/8$, and the width of the remaining electrode fingers 3b to 3n is about $\lambda/4$, where $\lambda$ denotes a wavelength of the SH-type wave that is excited on the piezoelectric substrate 2. Furthermore, the space or gap between the outermost electrode finger 4g of the sub-IDT portion 4A and the outermost electrode finger 4h of the sub-IDT portion 4B, and the space between the outermost electrode finger 3g of the sub-IDT portion 3A and the outermost electrode finger 3h of the sub-IDT portion 3B, and the spaces between other adjacent electrode fingers are set at about $\lambda/4$. That is, the space between the sub-IDTs 3A and 3B and the space between the sub-IDTs 4A and 4B are set at about $\lambda/4$.

The distance between the edge 2a and the edge 2b is generally set approximately to be equal to an integral multiple of $\lambda/2$.

In the SAW resonator filter 1, when an input voltage is applied to the bus bars 3o and 3p, SH-type waves are excited by the IDT 3 including the sub-IDT portions 3A and 3B. The excited SH-type waves are reflected by the edges 2a and 2b to form standing waves and generate resonance modes. Outputs based on the standing waves are detected by the IDT 4 including the sub-IDT portions 4A and 4B to also generate resonance modes. These resonance modes of the IDTs 3 and 4 are coupled together, to operate as a transversely coupled SAW resonator filter. The output is extracted from the bus bars 4o and 4p, which the electrode fingers 4b, 4d, 4f, 4i, 4k, and 4m of the IDT 4 are connected.

In the SAW resonator filter 1 of preferred embodiments of the present invention, the IDTs 3 and 4 are preferably divided in two as described above, and therefore the effective electromechanical coupling coefficient is lower than in the conventional transversely coupled SAW resonator filter 61 (see FIG. 20), and consequently the bandwidth can be made narrower. This will be explained with reference to FIG. 2 and FIG. 3.

Figure 20:
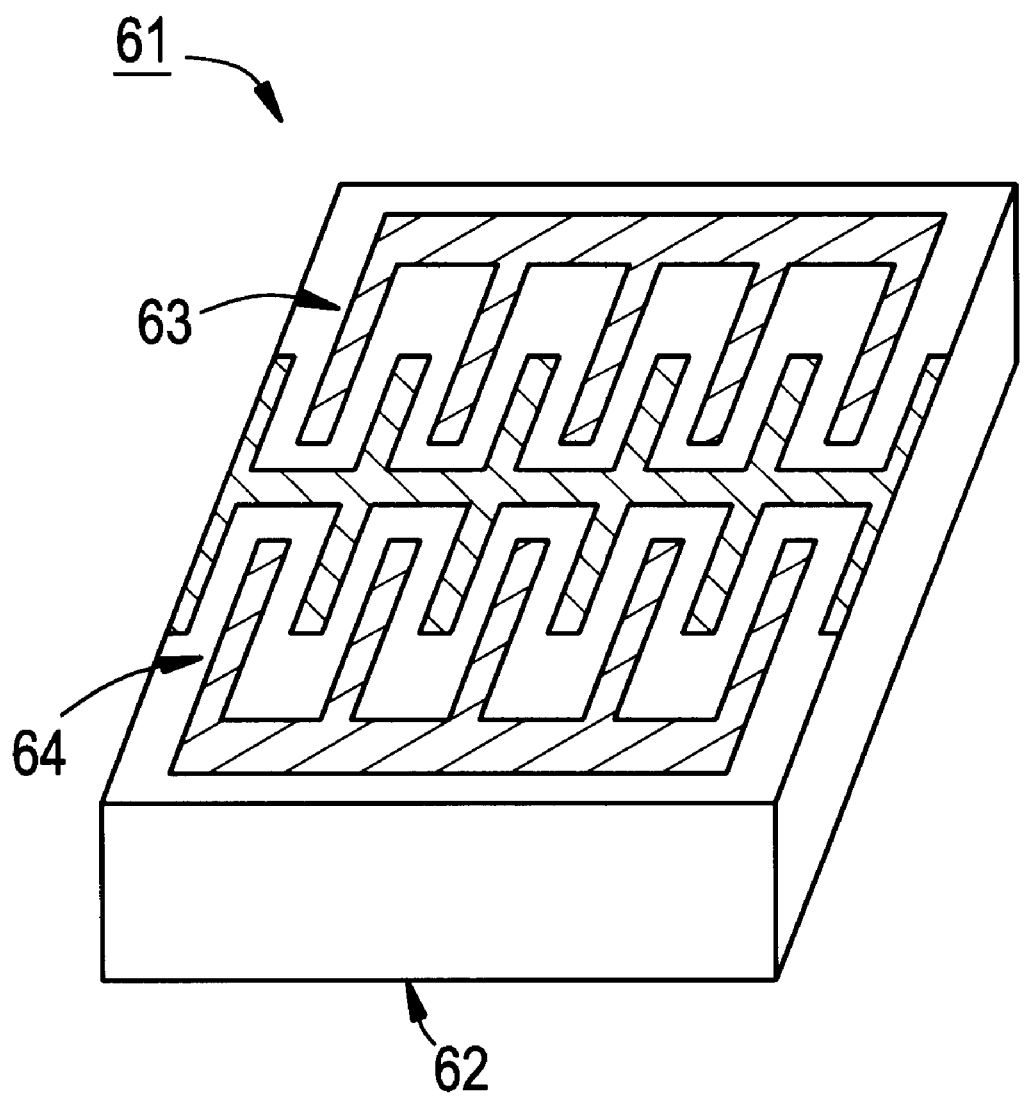
FIG. 20 is a perspective view of a conventional transversely coupled SAW resonator filter.

To compare, the conventional transversely coupled SAW resonator filter 61 shown in FIG. 20, and the transversely coupled SAW resonator filter 1 according to an example of preferred embodiments of the present invention, were made using a piezoelectric substrate comprising a piezoelectric ceramic of 2.0 mm×1.0mm×0.5 mm. The number of pairs of the electrode fingers of the IDT 63 and the IDT 3 was 34.5, the logarithm of the electrode fingers of the IDT 64 and the IDT 4 was 34.5, and the aperture (overlapping length) of the electrode fingers in each case was about 1.5 $\lambda$.

Furthermore, various SAW resonator filters were made in which the number of divisions of the IDTs 3 and 4 in the SAW resonator filter 1 was greater than 3.

In these SAW resonator filters, the relationship between the number of divisions of the IDTs 3 and 4, and the 10 dB attenuation bandwidth (which is a ratio expressed as the % of attenuation relative to the resonant frequency fr), and the relationship between the number of divisions and the insertion loss, was evaluated. The results are shown in FIG. 2 and FIG. 3, respectively.

Figure 2:
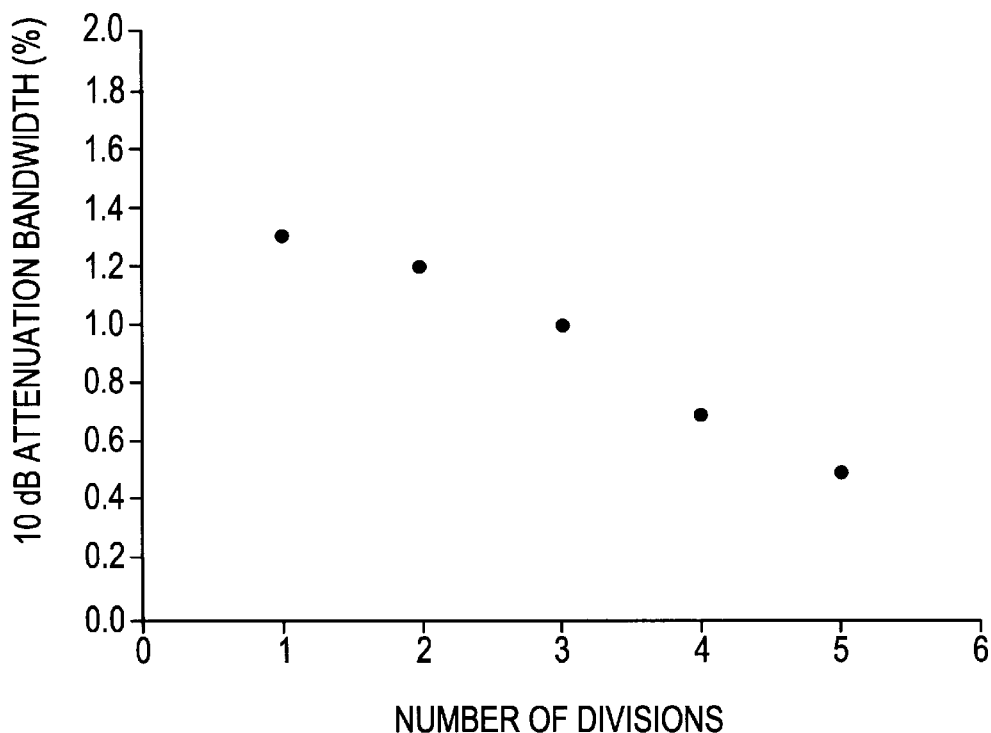
FIG. 2 is a diagram showing the relationship between the number of divisions of an IDT and the 10-dB attenuation bandwidth in a transversely coupled SAW resonator filter.
Figure 3:
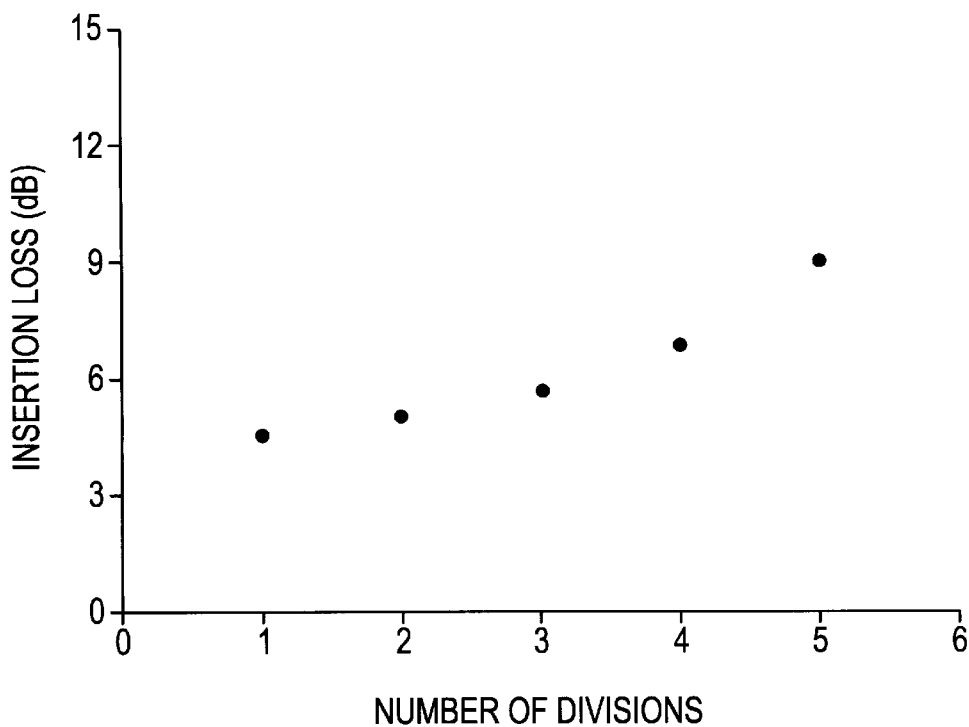
FIG. 3 is a diagram showing the relationship between number of divisions of an IDT and the insertion loss in a transversely coupled SAW resonator filter.

As is clear from FIG. 2 and FIG. 3, the bandwidth can be made narrower in the transversely coupled SAW resonator filter 1 by dividing the IDTs 3 and 4. Furthermore, it can be seen that as bandwidth becomes narrower, the number of divisions increases. But, note that when the number of divisions was increased from 4 to 5, insertion loss increased rapidly.

Therefore, it can be seen that the number of divisions should preferably be within a range of 2 to 4 in order to avoid a rapid increase in the insertion loss.

FIG. 4 to FIG. 7 are perspective views of the SAW resonator filter according to preferred embodiments of the present invention with modifications to the electrode structure.

Figure 4:
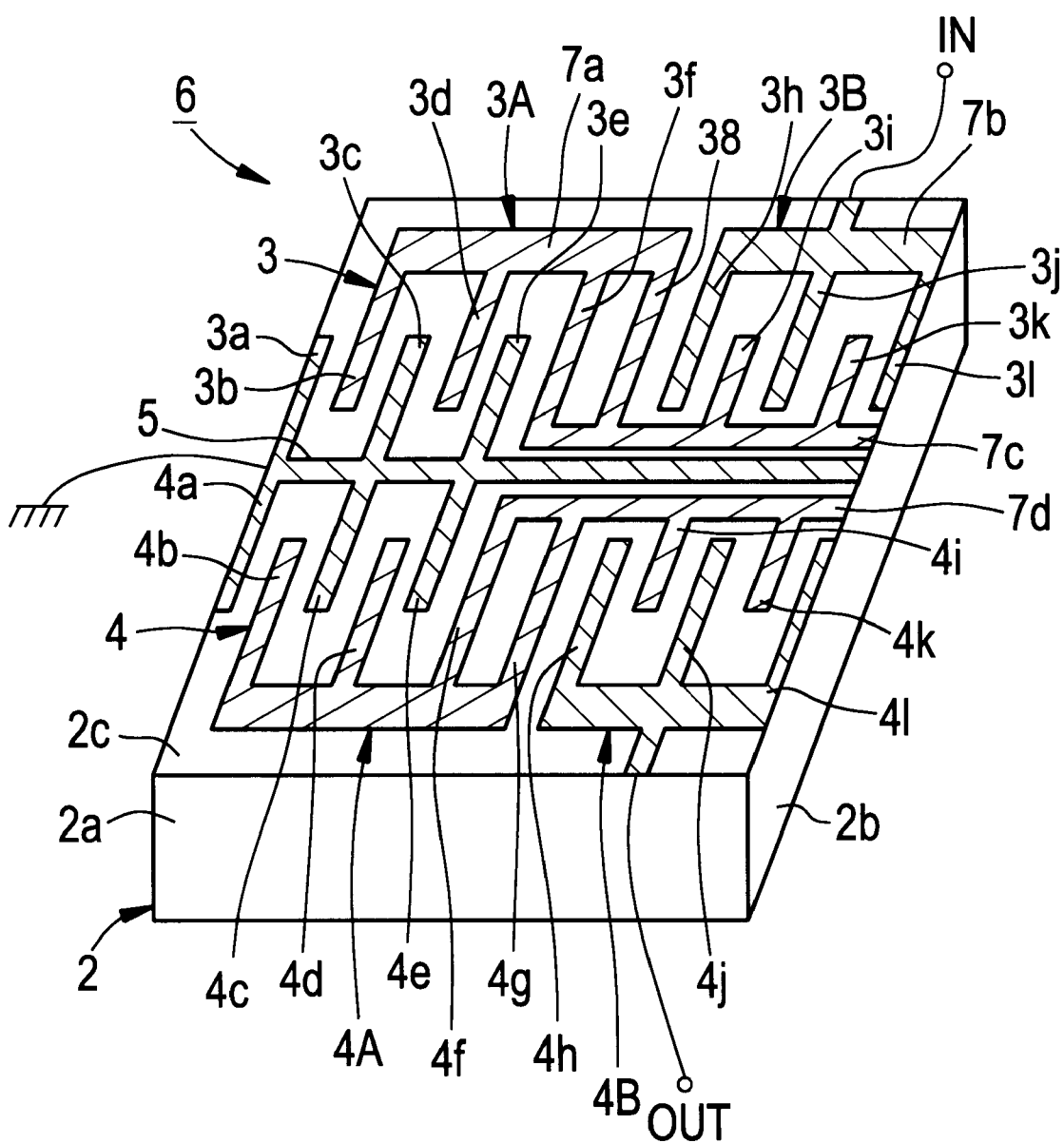
FIG. 4 is a perspective view showing another preferred embodiment of the transversely coupled SAW resonator filter of the present invention.

In the transversely coupled SAW resonator filter 6 shown in FIG. 4, the first and second IDTs 3 and 4 are each divided into two, but the way that the IDTs are divided differs from that of the SAW resonator filter of FIG. 1.

That is, in the SAW resonator filter 6, the first IDT 3 has sub-IDT portions 3A and 3B, but while the first sub-IDT portion 3A has multiple electrode fingers 3a to 3f, the second sub-IDT portion 3B only has electrode fingers 3g to 3l. The electrode fingers 3a to 3l are arranged in this sequence along the surface acoustic wave propagation direction.

Ends of the electrode fingers 3a, 3c, and 3e are connected to the common bus bar 5, and the other ends of the electrode fingers 3b, 3d, and 3f are electrically connected to a bus bar 7a. Moreover, the electrode finger 3f is electrically connected to a bus bar 7c, which is located near the common bus bar 5 and extends substantially parallel to the common bus bar 5. That is, one end of the electrode finger 3f is connected to the bus bar 7a, and the other end to the bus bar 7c. Similarly, in the sub-IDT portion 3B, one end of the electrode finger 3g is connected to the bus bar 7a, and the other end to the bus bar 7c. One end of the electrode fingers 3h, 3j, and 3l are connected to a bus bar 7b, and one end of the electrode fingers 3i and 3k are connected to the bus bar 7c. As a result of this arrangement of the electrode fingers, the adjacent outermost electrode fingers 3f and 3g of the sub-IDTs 3A and 3B and are electrically connected.

The electrode fingers 4a to 4l in the sub-IDT portion 4A have the same arrangement as the IDT 3. In the IDTs 3 and 4, the bus bars 7b and 7d are provided on the side of the sub-IDT portions 3B and 4B, and the bus bars 7b and 7d are electrically insulated from the common bus bar 5.

Figure 5:
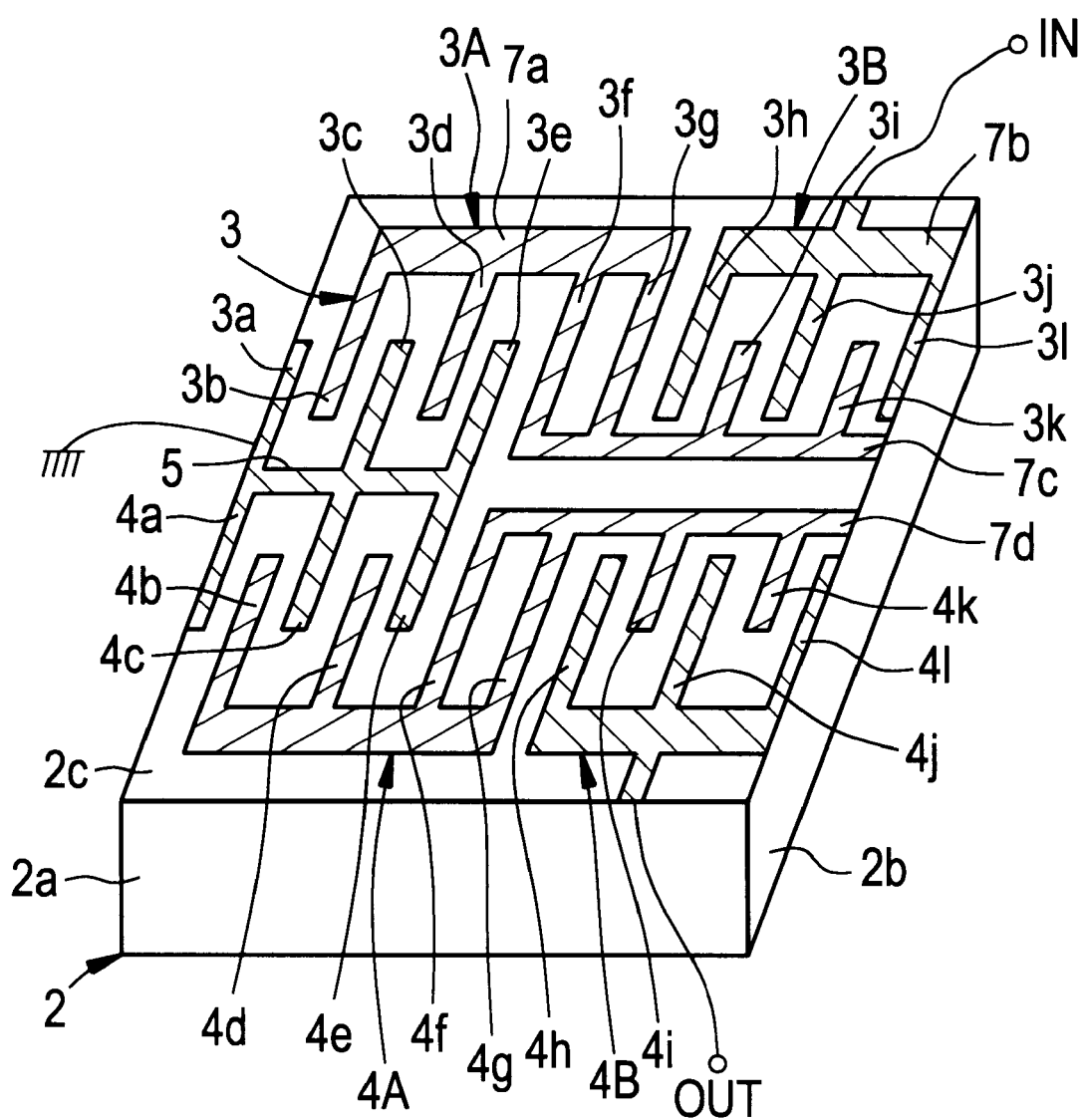
FIG. 5 is a perspective view showing still another preferred embodiment of the transversely coupled SAW resonator filter of the present invention.

FIG. 5 is a perspective view of another modification of the transversely coupled SAW resonator filter 1 wherein the first and second IDTs are divided into two parts. Here, it has substantially the same electrode structure as the SAW resonator filter 6 of FIG. 4, but the common bus bar 5 does not extend between the sub-IDT portions 3B and 4B.

As shown in FIG. 4 and FIG. 5, in the transversely coupled SAW resonator filters according to preferred embodiments of the present invention, the structure of the sub-IDTs may be varied. In these cases also, since the IDTs 3 and 4 are divided, the bandwidth can be made narrow as in the SAW resonator filter 1.

Figure 6:
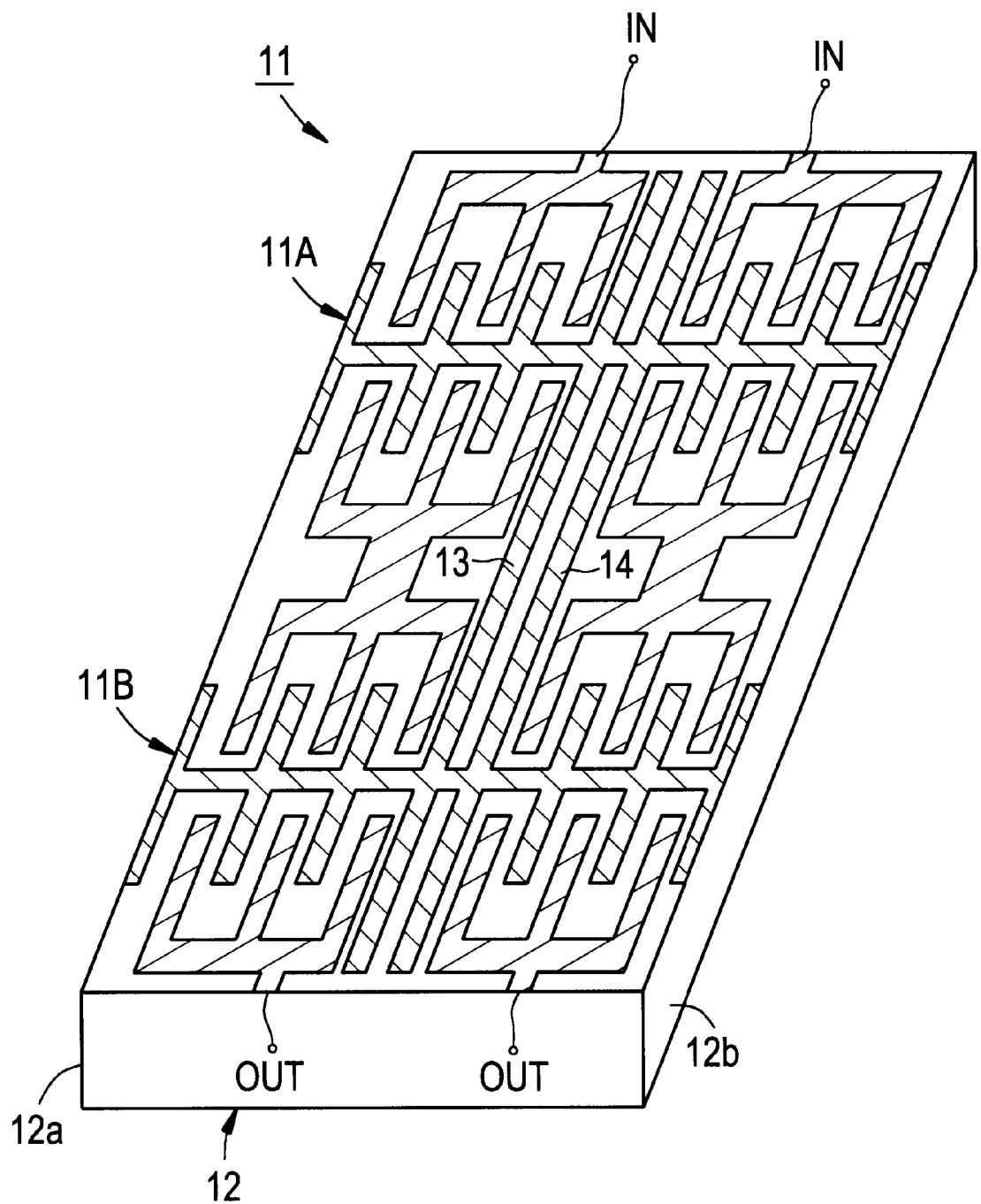
FIG. 6 is a perspective view of a preferred embodiment of a transversely coupled SAW resonator filter having multiple stage connections according to the present invention.

Moreover, as shown in FIG. 6, a multi-stage SAW resonator filter can be formed by arranging a plurality of transversely coupled SAW resonator filters on a piezoelectric substrate 12, and connecting them transversely. In the SAW resonator filter 11 shown in FIG. 6, a first SAW resonator filter portion 11A and a second SAW resonator filter portion 11B are provided between opposite ends 12a and 12b of the piezoelectric substrate 12. Each of the SAW resonator filter portions 11A and 11B have the same arrangement as the SAW resonator filter 1 of FIG. 1. Then, the SAW resonator filter portions 11A and 11B are electrically connected by connected lead portions 13 and 14, and the transversely coupled SAW resonator filter portions 11A and 11B are transversely connected.

In this way, in the transversely coupled SAW resonator filter according to preferred embodiments of the present invention, a SAW resonator filter having a multiple-stage arrangement can be provided by connecting a plurality of transversely coupled SAW resonator filter portions on a single piezoelectric substrate 12.

Figure 7:
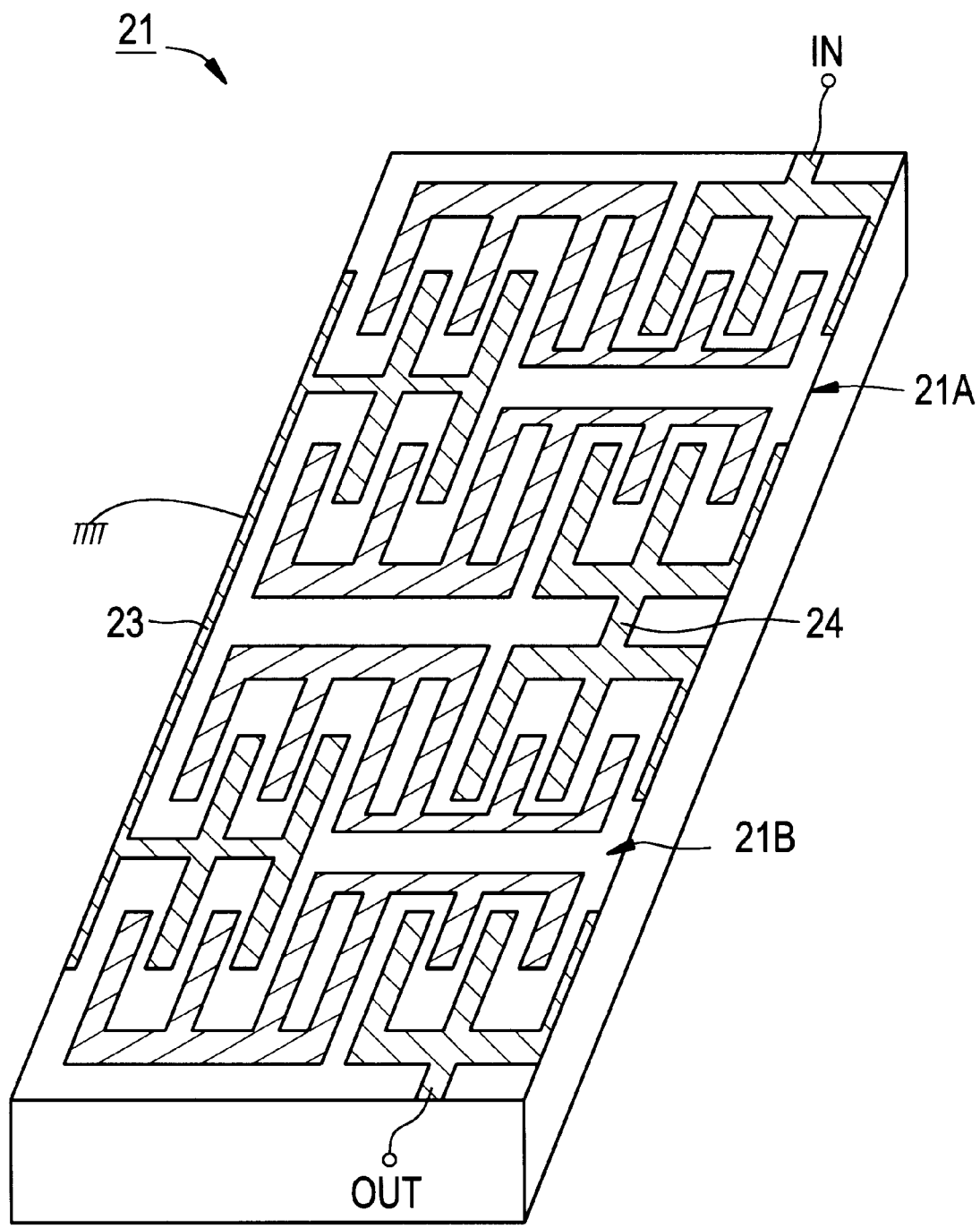
FIG. 7 is a perspective view of another preferred embodiment of a transversely coupled SAW resonator filter having multiple stage connections according to the present invention.

Further, FIG. 7 similarly shows a two-stage transversely connected resonator filter, in which two transversely coupled SAW resonator filters are provided on a single piezoelectric substrate. The SAW resonator filter 21 shown in FIG. 7 has an arrangement such that two of the SAW resonator filters 2 shown in FIG. 5 are arranged substantially perpendicular to the direction of propagation of the surface acoustic wave. The SAW resonator filter portions 21A and 21B are electrically connected, and transversely connected, by connection lead portions 23 and 24.

Figure 8:
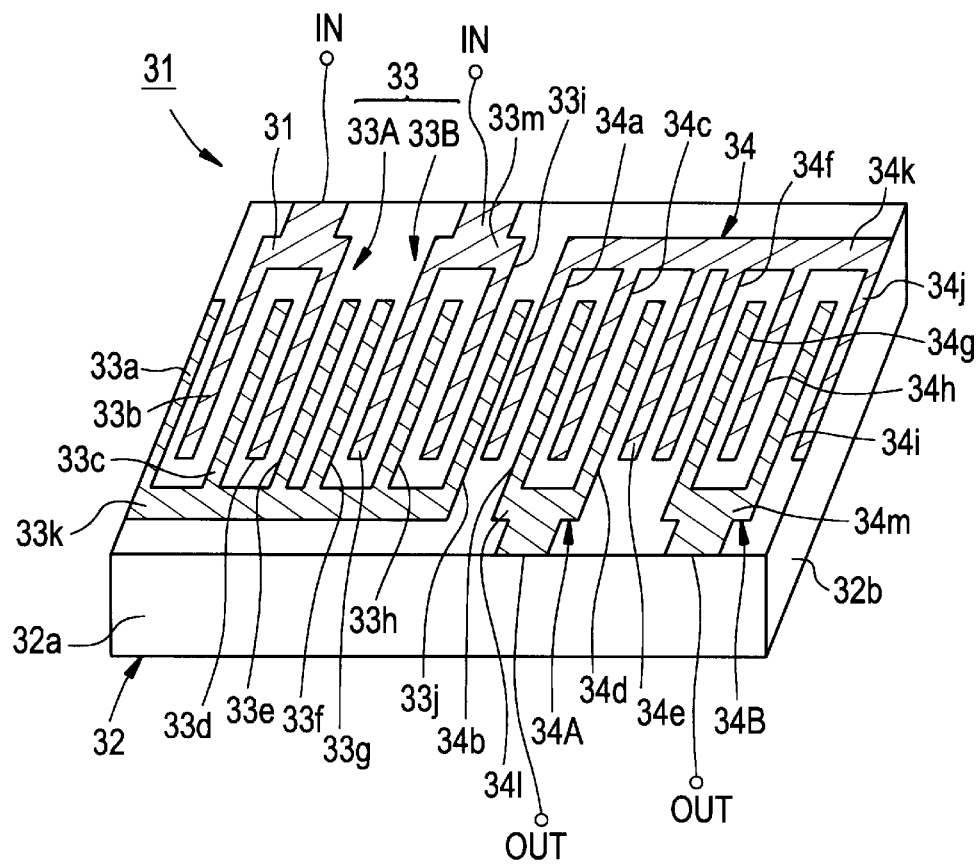
FIG. 8 is a perspective view of a longitudinally coupled SAW resonator filter according to a preferred embodiment of the present invention.

FIG. 8 is a perspective view showing a longitudinally coupled SAW resonator filter according to another preferred embodiment of the present invention.

The SAW resonator filter 31 is provided by using a substantially rectangular piezoelectric substrate 32. The piezoelectric substrate 32 is preferably made of the same material as the piezoelectric substrate 2. Similarly, the piezoelectric substrate 32 has opposing edges 32a and 32b. Further, first and second IDTs 33 and 34 are provided on the top surface 32c of the piezoelectric substrate 32. The IDTs 33 and 34 are preferably defined by patterning a metal film such as aluminum.

The IDT 33, which defines a first SAW resonator has multiple electrode fingers 33a to 33j, which extend substantially perpendicular to the direction of propagation of the surface acoustic wave, and is divided into two sub-IDT portions 33A and 33B. That is, the sub-IDT portion 33A has electrode fingers 33a to 33e, and the sub-IDT portion 33B has the electrode fingers 33f to 33j.

In the sub-IDT portion 33A, ends of the electrode fingers 33a, 33c, and 3e are electrically connected to a common bus bar 33k that extends along the surface acoustic wave propagation direction. On the other hand, the electrode fingers 33b and 33d are connected to a bus bar 31. Therefore, the electrode fingers 33a, 33c and 33e are arranged so that they are interdigitated with the electrode fingers 33b and 33d.

In the sub-IDT portion 33B, ends of the electrode fingers 33f, 33h and 33j are connected to the bus bar 33k. Furthermore, ends of the electrode fingers 33g and 33i are electrically connected to a bus bar 33m. Therefore, the electrode fingers 33f, 33h and 33j are arranged so as to be interdigitated with the electrode fingers 33g and 33i.

As a result of the connection, sub-IDTs 33A and 33B are connected in series between a pair of input terminals IN and aligned along the surface acoustic wave propagation direction.

The electrode finger 33a is provided along the end edge defined by the edge 32a and the top surface 32c, and has a width of approximately $\lambda/8$ when the wavelength of the excited surface acoustic wave is $\lambda$. The width of the remaining electrode fingers 33b to 33j is approximately $\lambda/4$. Furthermore, the width of the gaps extending along the surface acoustic wave propagation direction between the electrode fingers is approximately $\lambda/4$. That is, the space between the sub-IDTs 33A and 33B is set at about $\lambda/4$.

The IDT 34 defining the second resonator is provided along the surface acoustic wave propagation direction with respect to the IDT 33. Like the IDT 33, the IDT 34 has two sub-IDT portions 34A and 34B. The sub-IDT portion 34A is provided on the side of the IDT 33, and has electrode fingers 34a to 34e. The sub-IDT portion B has electrode fingers 34f to 34j.

In the sub-IDT portion 34A, ends of the electrode fingers 34a, 34c and 34e are connected to a bus bar 34k. On the other hand, ends of the electrode fingers 34b and 34d are connected to a bus bar 34l, on the opposite side of the bus bar 34k. Similarly, in the sub-IDT portion 34B, ends of the electrode fingers 34f, 34h and 34j are connected to a bus bar 34k, and ends of the electrode fingers 34g and 34i are connected to the bus bar 34m.

In the sub-IDT portion 34A, the electrode fingers 34a, 34c and 34e are arranged so as to be interdigitated with the electrode fingers 34b and 34d. In the sub-IDT portion 34B, the electrode fingers 34f, 34h and 34j are arranged so as to be interdigitated with the electrode fingers 34g and 34i.

As a result of the connection, sub-IDTs 34A and 34B are connected in series between a pair of output terminals OUT and aligned along the direction of propagation of the surface acoustic wave.

Further, the outermost side electrode finger 34j is provided along the edge defined by the edge 32b and the top surface 32c of the piezoelectric substrate 32. This electrode finger 34j has a width of approximately $\lambda/8$, similar to the electrode finger 33a. Further, the width of the remaining electrode fingers 34a to 34i, and the width of the gaps extending along the surface acoustic wave propagation direction between the electrode fingers, is approximately $\lambda/4$. That is, the space between the sub-IDTs 34A and 34B is about $\lambda/4$. In addition, the space between the IDT 33 and the IDT 34 is about $\lambda/4$.

In the longitudinally coupled SAW resonator filter 31 of the present preferred embodiment, the above-mentioned IDTs 33 and 34 are provided between the two opposite edges 32a and 32b, thereby defining an edge reflection type SAW resonator filter. During operation, SH-type surface acoustic waves, for instance BGS waves or Love waves, are excited and resonance modes created by the resonators including the IDTs 33 and 34 are coupled, whereby the filter operates as a longitudinally coupled SAW resonator filter.

According to the SAW resonator filter 31 of the present preferred embodiment, in the edge reflection type SAW resonator filter having the IDTs 33 and 34 as described above, since each of the IDTs 33 and 34 is divided so as to have sub-IDT portions 33A and 33B, and sub-IDT portions 34A and 34B respectively, the effective electromechanical coupling coefficient is decreased. Therefore, the frequency differences $\Delta f$ between the anti-resonant frequency and the resonant frequency of each of the two resonators are both greatly reduced. Consequently, with the longitudinally coupled resonator filter created by the coupling of the two resonators, the bandwidth can be made narrower than in the conventional longitudinally coupled SAW resonator filter 51 shown in FIG. 19. This will be explained based on a detailed test example.

Figure 10:
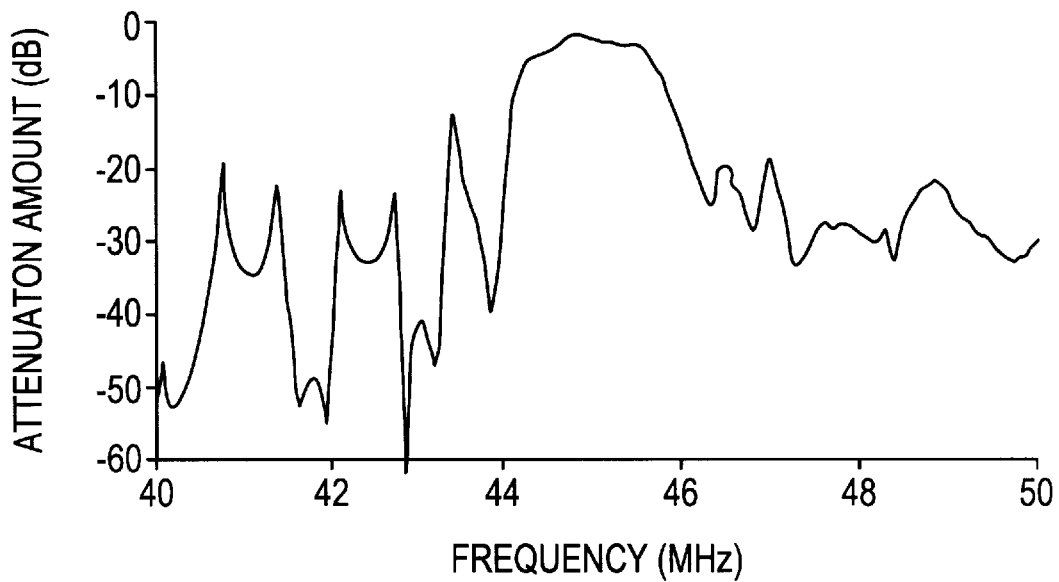
FIG. 10 is a diagram showing the frequency vs. amplitude characteristics of a conventional longitudinally coupled SAW resonator filter.
Figure 19:
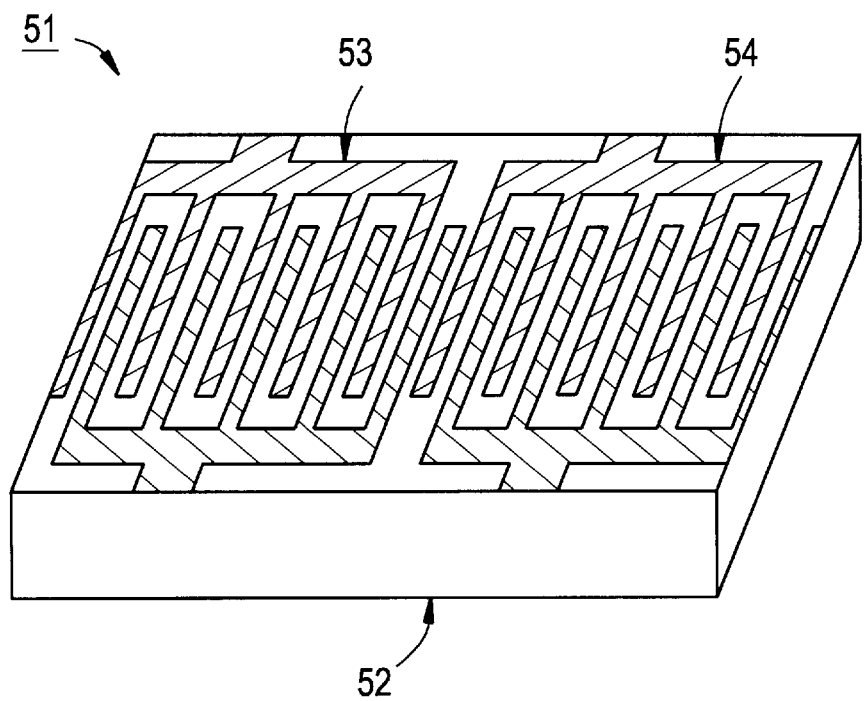
FIG. 19 is a perspective view of a conventional longitudinally coupled SAW resonator filter.

As shown in FIG. 19, a conventional SAW resonator filter 51 having a center frequency of 41.3 MHz was made using a substantially rectangular piezoelectric substrate including ceramic material and having dimensions of 2.1 mm×1.2 mm with a thickness of 0.5 mm, as the piezoelectric substrate 52, the logarithms of the electrode fingers of the IDTs 53 and 54 being, respectively 20 pairs and 15 pairs, and the width of the intersections of the electrode fingers being 4 λ in each case. FIG. 10 shows the frequency amplitude characteristics of this SAW resonator filter 51.

Figure 11:
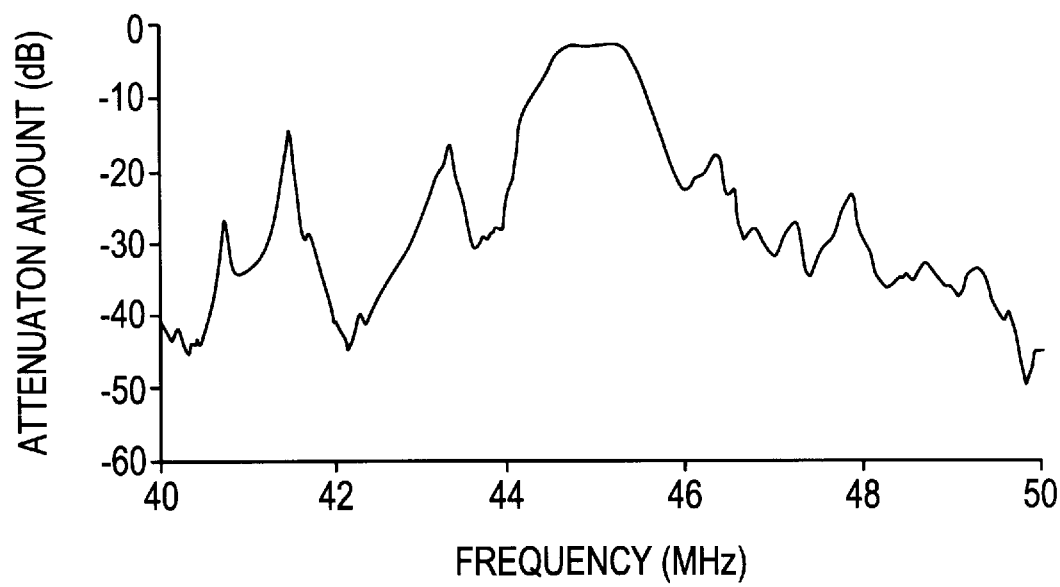
FIG. 11 is a diagram showing the frequency vs. amplitude characteristics of a longitudinally coupled SAW resonator filter according to a preferred embodiment of the present invention show in FIG. 8.

For comparison, a SAW resonator filter 31 of the present preferred embodiment with a center frequency of 41.3 MHz was made using the same piezoelectric substrate as above, the logarithms of the electrode fingers of the IDTs 33 and 34 being, respectively 20 pairs and 15 pairs, the width of the intersections of the electrode fingers being 4 λ in each case, but the IDTs 33 and 34 being divided into two as shown in FIG. 8. FIG. 11 shows the attenuation frequency characteristics of the SAW resonator filter 31.

In the characteristics of the SAW resonator filter 51 as shown in FIG. 10, the width of the 3 dB attenuation band where the attenuation amount is 3 dB was 1170 kHz, but in the present preferred embodiment, it was narrowed to 860 kHz. Therefore, it can be seen that according to the SAW resonator filter 31 of the present preferred embodiment, the bandwidth is narrower than in the conventional SAW resonator filter 51 which uses undivided IDTs 53 and 54.

Figure 9:
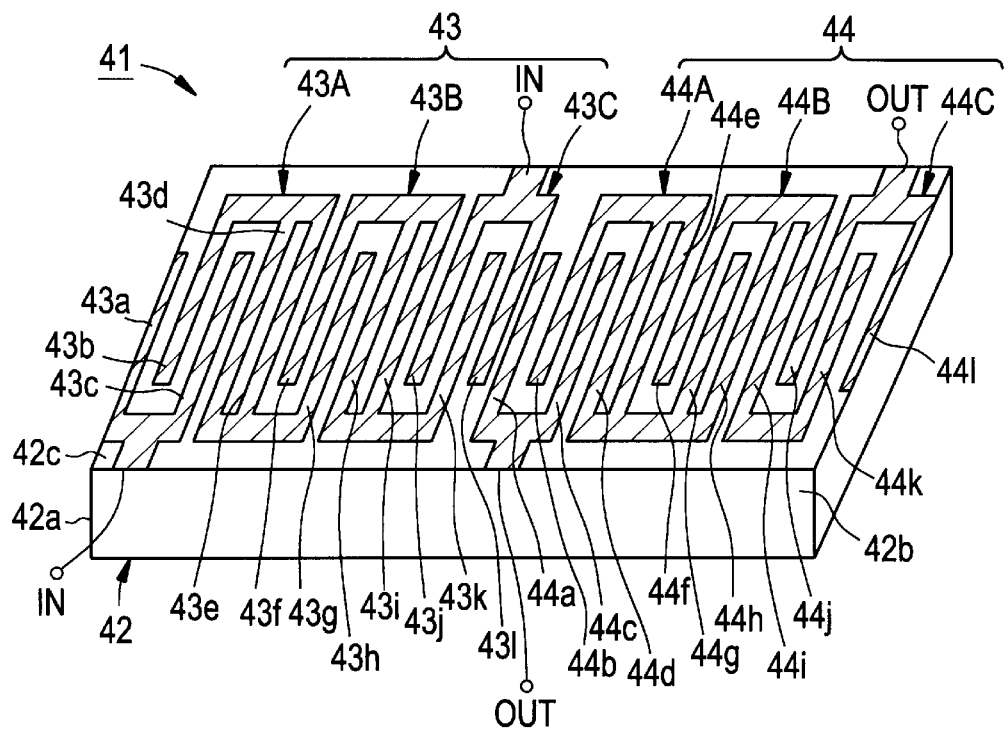
FIG. 9 is a perspective view of a longitudinally coupled SAW resonator filter according to another preferred embodiment of the present invention.

FIG. 9 is a perspective view showing a longitudinally coupled SAW resonator filter according to another preferred embodiment of the present invention. In the SAW resonator filter 41 of FIG. 9, a substantially rectangular piezoelectric substrate 42 has opposing edges 42a and 42b. The piezoelectric substrate 42 includes the same material as the piezoelectric substrate 2 of FIG. 1. First and second IDTs 43 and 44 are provided on the top surface 42c of the piezoelectric substrate 42 along the surface acoustic wave propagation direction.

The SAW resonator filter 41 of the present preferred embodiment differs from the SAW resonator filter 31 of FIG. 8 in that the first and second IDTs 43 and 44 each have three sub-IDT portions 43A to 43C, and 44A to 44C, which are connected in series, respectively.

That is, taking the IDT 43 as an example, the IDT 43 has electrode fingers 43a to 43l extending substantially perpendicular to the direction of propagation of the surface acoustic wave, but the sub-IDT portion 43A has electrode fingers 43a to 43d, the sub-IDT portion 43B has electrode fingers 43e to 43h, and the sub-IDT portion 43C has electrode fingers 43i to 43l.

The width of the electrode finger 43a is approximately λ/8, and the width of the remaining electrode fingers 43b to 43l is approximately λ/4. Furthermore, the width of the gaps extending along the surface acoustic wave propagation direction between the electrode fingers is approximately λ/4.

The IDT 44 has electrode fingers 44a to 44l, and like the IDT 43 it has three sub-IDT portions 44A to 44C.

In the IDT 44, the electrode finger 44l is provided along the edge defined by the edge 42b and the top surface 42c, has a width of approximately λ/8, and the remaining electrode fingers 44a to 44k have a width of approximately λ/4.

As described above, in the SAW resonator filter 41, the IDTs 43 and 44 each define SAW resonators, and the IDTs 43 and 44 are divided so as to have three sub-IDT IDT portions 43A to 43C, and 44A to 44C. Consequently, the effective electromechanical coupling coefficient can be reduced even further than in the SAW resonator filter 31 of the previously described preferred embodiment, thus further narrowing the bandwidth. This will be explained based on a detailed test example.

Figure 12:
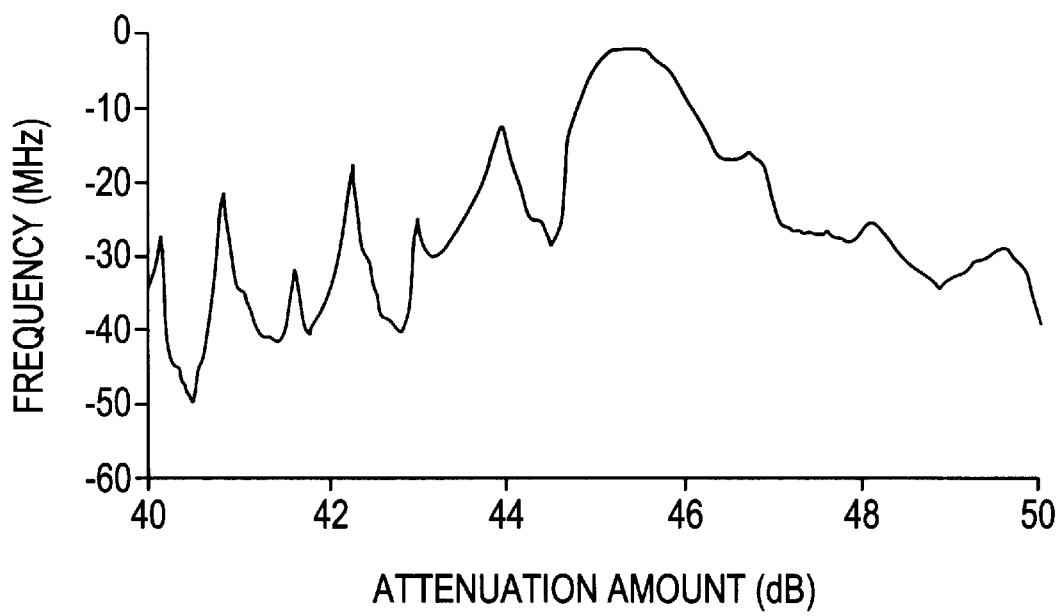
FIG. 12 is a diagram showing the frequency vs. amplitude characteristics of a longitudinally coupled SAW resonator filter according to a preferred embodiment of the present invention shown in FIG. 9.

FIG. 12 shows frequency amplitude characteristics of the SAW resonator filter 41 made in the same way as the SAW resonator filter 31 in the preceding experimental example, characteristics of which are shown, respectively in FIG. 10 and FIG. 11 above, with the exception that the IDTs 43 and 44 are divided into three so as to have sub-IDT portions 43A to 43C, and 44A to 44C, as described above. As is clear from a comparison of FIG. 12 with FIGS. 10 and 11, by dividing the IDTs 43 and 44 into three portions, the bandwidth can be narrowed even further.

Furthermore, the inventors of the present invention made longitudinally coupled SAW resonator filters where the first and second IDTs were divided into four and five portions, while being identical in other respects to the above test example, and measured the frequency amplitude characteristics. The results are shown in FIG. 13 and FIG. 14.

Figure 13:
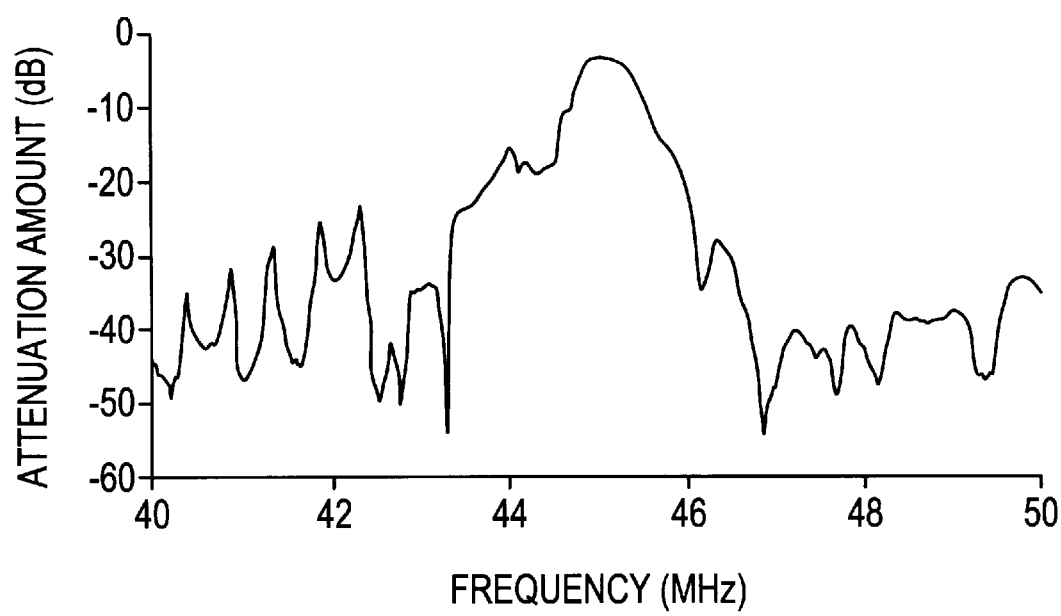
FIG. 13 is a diagram showing the frequency vs. amplitude characteristics of a longitudinally coupled SAW resonator filter when an IDT is divided into four according to a preferred embodiment of the present invention.
Figure 14:
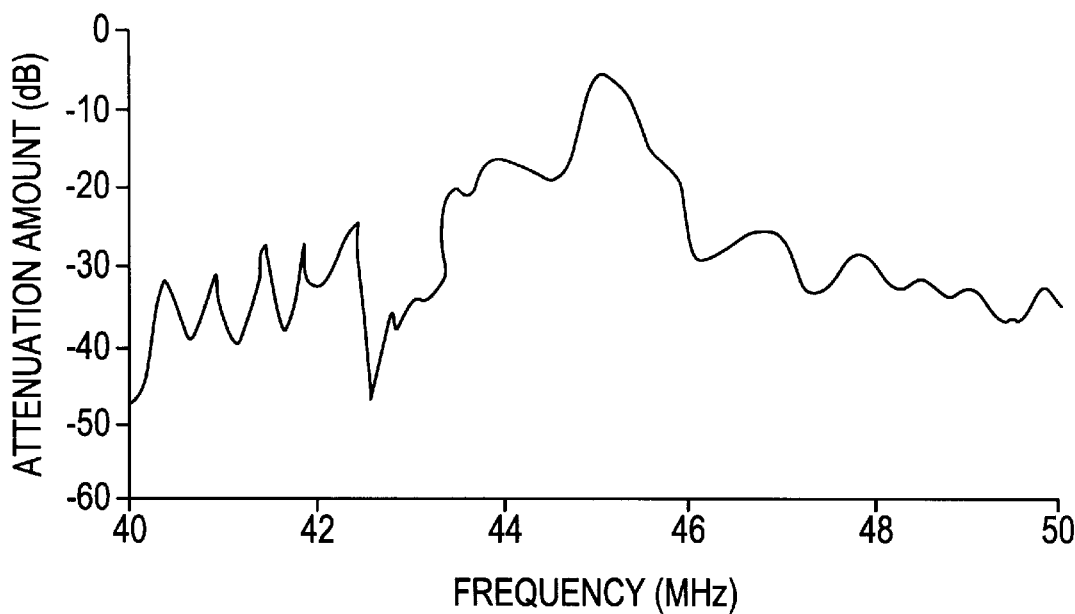
FIG. 14 is a diagram showing frequency amplitude characteristics of a longitudinally coupled SAW resonator filter when an IDT is divided into five according to a preferred embodiment of the present invention.

As is clear by comparing FIG. 13 and FIG. 14 with FIG. 11 and FIG. 12, it is possible to obtain an even narrower band by increasing the number of divisions.

Figure 15:
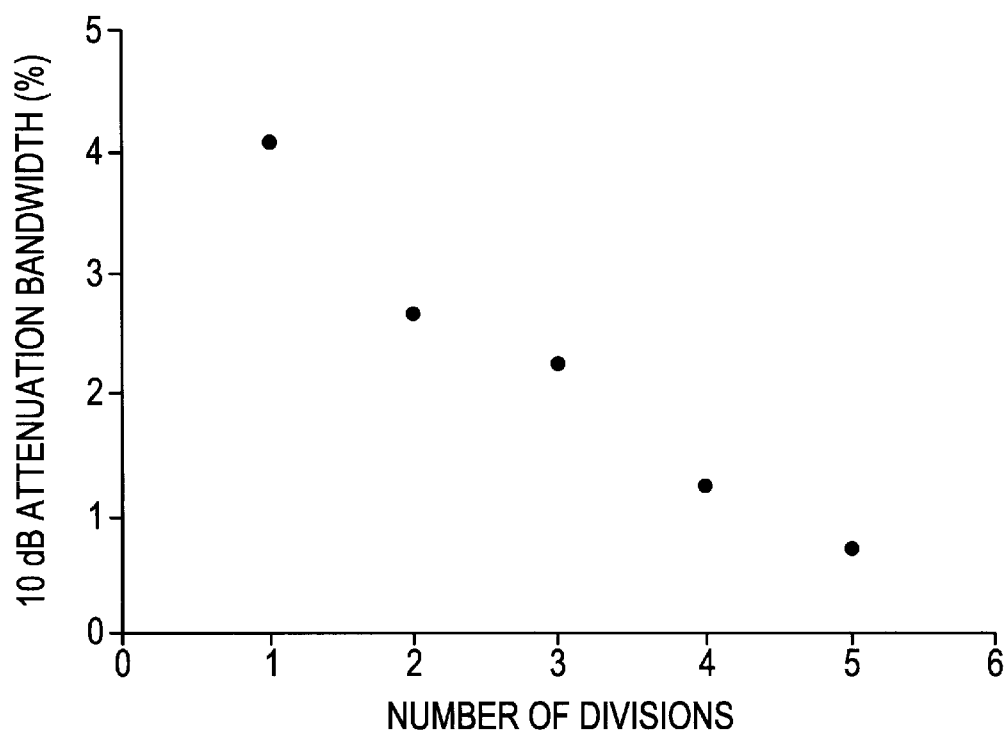
FIG. 15 is a diagram showing the relationship between the number of divisions of an IDT and a 10 dB attenuation bandwidth in a longitudinally coupled SAW resonator filter of a preferred embodiment of the present invention.
Figure 16:
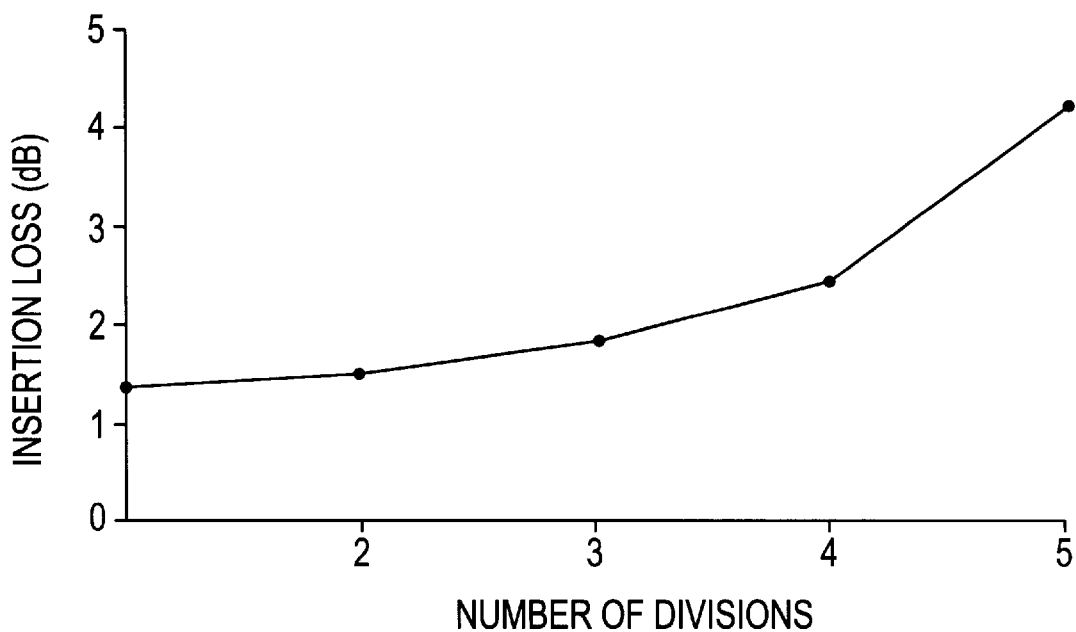
FIG. 16 is a diagram showing the relationship between the number of divisions of an IDT and insertion loss in a longitudinally coupled SAW resonator filter of a preferred embodiment of the present invention.
Figure 17:
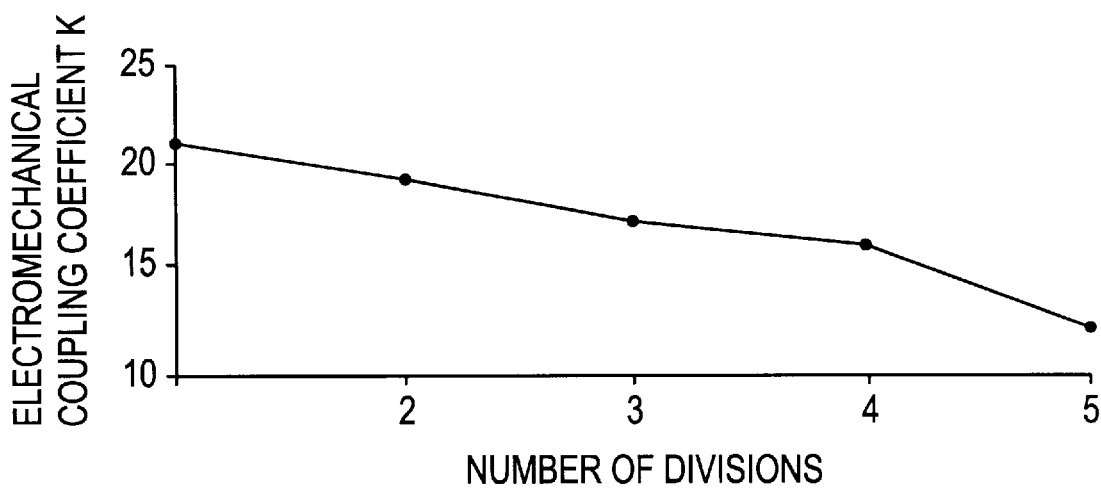
FIG. 17 is a diagram showing the relationship between the number of divisions of a SAW resonator of one IDT and an effective electromechanical coupling coefficient K in a longitudinally coupled SAW resonator filter of a preferred embodiment of the present invention.
Figure 18:
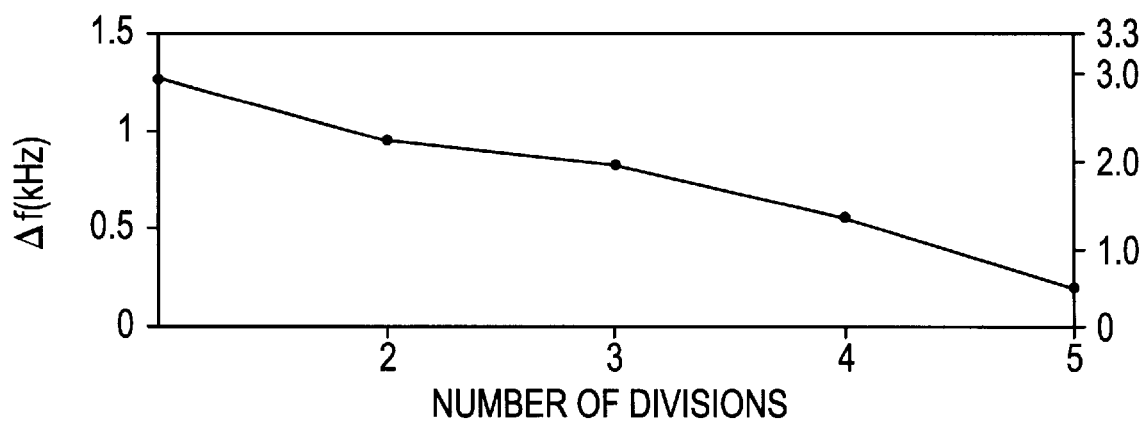
FIG. 18 is a diagram showing the relationship between a number of divisions of an IDT, and the frequency difference ΔF between a resonant frequency and an anti-resonant frequency, evaluated from the IDT on one side of a longitudinally coupled SAW resonator filter.

Considering the results of FIG. 12 to FIG. 14, various SAW resonator filters having different numbers of IDT divisions were made, and the relationship between the number of divisions, the 10 dB attenuation bandwidth, and the insertion loss, were determined. The results are shown in FIG. 15 and FIG. 16. Furthermore, the relationship between the number of divisions, the electromechanical coupling coefficient, and the frequency difference Δf between the resonant frequency and the anti-resonant frequency, determined from the resonance characteristics of the IDT on one side of the resonator filter, was determined. The results are shown in FIG. 17 and FIG. 18.

As is clear from FIGS. 15 to 18, the width of the 10 dB attenuation band becomes narrower as the number of divisions of the IDT increases, making it possible to narrow the bandwidth. However, it can be seen that insertion loss increases as the number of division increases. In particular, when the number of divisions is increased from four to five, the insertion loss is increased rapidly as seen in FIG. 16.

Therefore, when forming an edge reflection type longitudinally coupled SAW resonator filter using SH-type surface acoustic waves, the number of divisions of the first and second IDTs should preferably be within a range of two to four, thereby allowing the bandwidth to be very narrow while preventing an increase in the insertion loss.

The present invention can be suitably applied to various electronic components or devices utilizing a surface acoustic wave filter in which the unique features of preferred embodiments of the present invention are successfully employed. For example, the present invention may be applied to a duplexer and communication apparatus including the duplexer.

Figure 21:
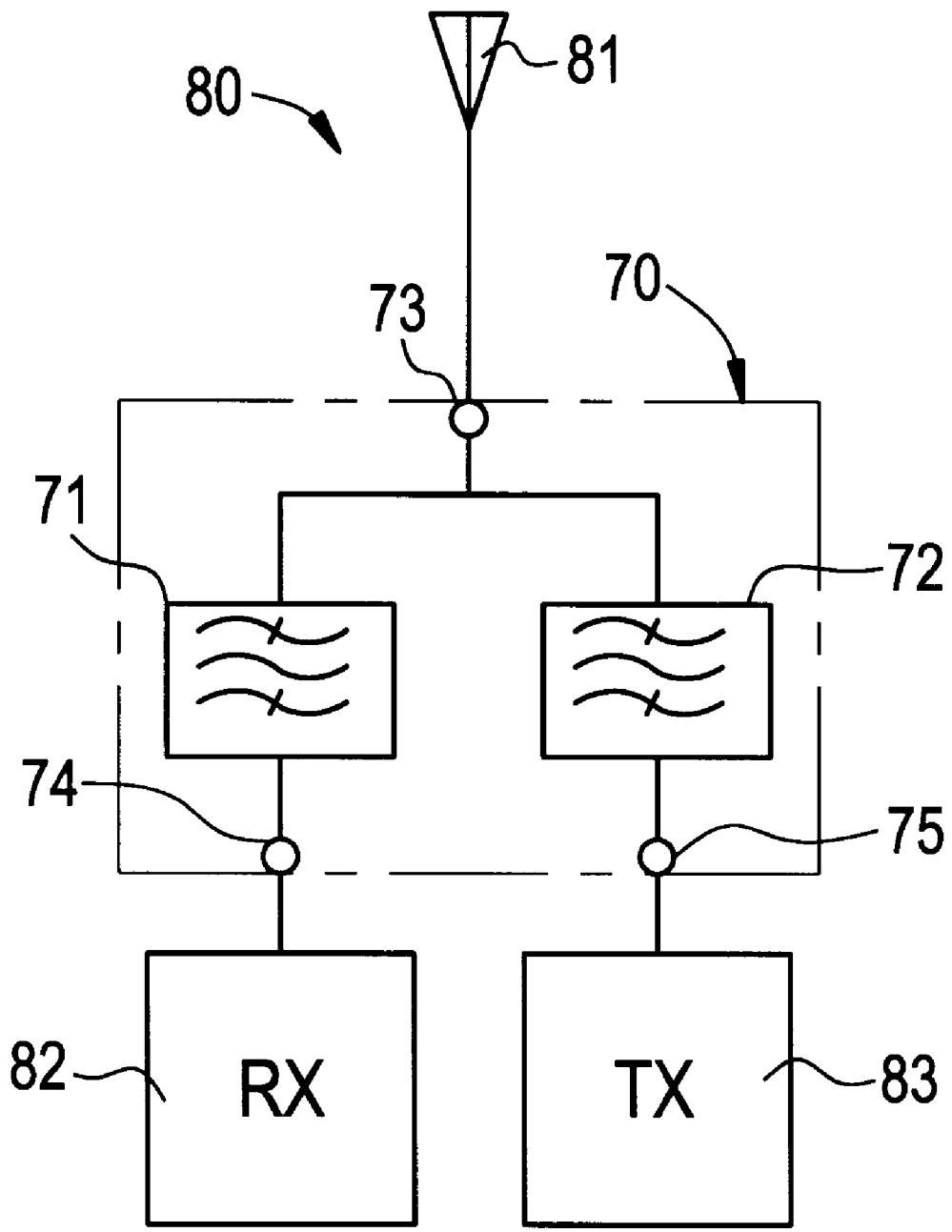
FIG. 21 is a block diagram showing a communication apparatus according to a preferred embodiment of the present invention.

FIG. 21 is a block diagram of a communication apparatus 80 having a duplexer 70. The communication apparatus 80 may be, for example, a cellular phone since a cellular phone usually requires a small handy body and a high selectivity of signals and so is suitable to enjoy the benefits of a filter made according to the present invention.

The communication apparatus 80 includes a duplexer 70, an antenna 81, a receiver 82 and a transmitter 83. The duplexer 70 preferably includes a SAW filter 71 and a SAW filter 72, where one end of the SAW filter 71 and the SAW filter 72 are connected in parallel to define a first terminal 73. The other ends of the SAW filter 71 and the SAW filter 72 are connected to a second terminal 74 and a third terminal 75. The SAW filter 71 and the SAW filter 72 may be any one of the SAW filters of preferred embodiments of the present invention. The antenna 81, the receiver 82 and the transmitter 83 are connected to the first terminal 73, the second terminal 74 and the third terminal 75 of the duplexer 70.

The pass bands of the SAW filters 71 and 72 of the duplexer 70 are selected such that the signals received through the antenna 81 passes through the SAW filter 71 and are blocked by the SAW filter 72 and that the signals to be transmitted from the transmitter 83 passes through the SAW filter 72.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A SAW resonator filter comprising:
   a piezoelectric substrate; and
   first and second resonators arranged on the piezoelectric substrate, the first and second resonators including first and second interdigital transducers having electrode fingers, respectively, wherein the first and second interdigital transducers are acoustically coupled to form a filter, and wherein the first and second interdigital transducers are divided into a plurality of sub-interdigital transducer portions, respectively, and the first and second resonators are arranged on the piezoelectric substrate to generate shear horizontal waves that are reflected by edges of the piezoelectric substrate.

2. The SAW resonator filter according to claim 1, wherein the interdigital transducers are longitudinally coupled.

3. The SAW resonator filter according to claim 1, wherein the interdigital transducers are transversely coupled.

4. The SAW resonator filter according to claim 1, wherein the piezoelectric substrate has opposing first and second edges, and wherein the electrode fingers of the first and second interdigital transducers are substantially parallel to the first and second edges.

5. The SAW resonator filter according to claim 1, wherein the interdigital transducers that are divided into the plurality of sub-interdigital transducers are divided such that a first of the sub-interdigital transducer portions has a same amount of electrode fingers as a second of the sub-interdigital transducer portions.

6. The SAW resonator filter according to claim 1, wherein the first and second interdigital transducers are divided such that the first and second interdigital transducers have between two to four sub-interdigital transducer portions, respectively.

7. The SAW resonator filter according to claim 1, wherein the plurality of sub-interdigital transducers are electrically connected in series within the first and second interdigital transducers, respectively.

8. The SAW resonator filter according to claim 7, wherein at least one of the first and second interdigital transducers comprises a common bus bar that electrically connects in series the plurality of sub-interdigital transducers.

9. The SAW resonator filter according to claim 1, wherein the first and second interdigital transducers comprise a common bus bar that is located between the plurality of sub-interdigital transducers.

10. The SAW resonator filter according to claim 1, further comprising a filter having a plurality of stages, wherein at least one stage of the filter includes the first and second resonators.

11. The SAW resonator filter according to claim 1, wherein the first and second interdigital transducers are arranged on the piezoelectric substrate in a direction that is substantially perpendicular to a direction of propagation of a surface acoustic wave.

12. The SAW resonator filter according to claim 1, wherein the first and second interdigital transducers are arranged on the piezoelectric substrate in a direction that is substantially parallel to a direction of propagation of a surface acoustic wave.

13. A SAW resonator filter comprising:
    a piezoelectric substrate; and
    resonators arranged on the piezoelectric substrate, the resonators including a plurality of interdigital transducers having electrode fingers, wherein the interdigital transducers are arranged so as to be acoustically coupled to form a filter, wherein the interdigital transducers are divided into a plurality of sub-interdigital transducer portions, and wherein the sub-interdigital transducer portions are connected in series, and the resonators are arranged on the piezoelectric substrate to generate shear horizontal waves that are reflected by edges of the piezoelectric substrate.

14. A communication apparatus having a duplexer, wherein the duplexer comprises:
    a piezoelectric substrate; and
    first and second resonators arranged on the piezoelectric substrate, the first and second resonators including first and second interdigital transducers having electrode fingers, respectively, wherein the first and second interdigital transducers are acoustically coupled to form a filter, and wherein the first and second interdigital transducers are divided into a plurality of sub-interdigital transducer portions, respectively, and the first and second resonators are arranged on the piezoelectric substrate to generate shear horizontal waves that are reflected by edges of the piezoelectric substrate.

15. The communication apparatus according to claim 14, wherein the interdigital transducers are coupled at least one of longitudinally and transversely.

16. The communication apparatus according to claim 14, wherein the first and second interdigital transducers are divided such that the first and second interdigital transducers have between two to four sub-interdigital transducer portions, respectively.

17. The communication apparatus according to claim 14, wherein the plurality of sub-interdigital transducer portions are electrically connected in series within the first and second interdigital transducers, respectively.

18. The communication apparatus according to claim 14, further comprising a filter having a plurality of stages, wherein at least one stage of the filter includes the first and second resonators.

* * * * *